United States Patent
Lee

(10) Patent No.: US 7,030,357 B2
(45) Date of Patent: Apr. 18, 2006

(54) UNIT PIXEL IN CMOS IMAGE SENSOR WITH HIGH SENSITIVITY

(75) Inventor: Won-Ho Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 217 days.

(21) Appl. No.: 10/745,042

(22) Filed: Dec. 22, 2003

(65) Prior Publication Data

US 2004/0217262 A1    Nov. 4, 2004

(30) Foreign Application Priority Data

Apr. 30, 2003   (KR) ................ 10-2003-0027890

(51) Int. Cl.
   *H01L 27/00* (2006.01)

(52) U.S. Cl. .................. 250/208.1; 348/308; 257/292

(58) Field of Classification Search ............ 250/208.1, 250/214.1; 257/292; 348/302, 308
See application file for complete search history.

(56) References Cited

U.S. PATENT DOCUMENTS

2002/0190188 A1* 12/2002 Machida .............. 250/208.1

* cited by examiner

*Primary Examiner*—Thanh X. Luu
(74) *Attorney, Agent, or Firm*—Blakely Sokoloff Taylor & Zafman

(57) ABSTRACT

A unit pixel in a CMOS image sensor with a high sensitivity is employed by modifying a unit pixel circuit and a layout. The unit pixel in the CMOS image sensor including: an active area defined by an FOX; a photodiode formed in a predetermined location of the active area; a transfer transistor including source/drain regions disposed between the photodiode and a floating diffusion node, wherein a transfer control signal is applied to a gate thereof; a reset transistor including source/drain regions disposed between the floating diffusion node and a power supply voltage (VDD) terminal, wherein a reset control signal is applied to a gate and a VDD is applied to a drain; a drive transistor of which a gate is connected to the VDD terminal and a drain is connected to the floating diffusion node; and a selection transistor of which a drain is connected to a source of the drive transistor and a source is connected to an output terminal, wherein a select control signal is applied to a gate thereof.

17 Claims, 8 Drawing Sheets

UNIT PIXEL IN CMOS IMAGE SENSOR WITH HIGH SENSITIVITY

FIELD OF THE INVENTION

The present invention relates to a semiconductor device; and, more particularly, to a unit pixel in a complementary metal oxide semiconductor (CMOS) image sensor with a high sensitivity by modifying a unit pixel circuit and a layout.

DESCRIPTION OF THE PRIOR ART

A complementary metal oxide semiconductor (CMOS) image sensor is a device that converts an optical image to an electrical signal using a CMOS manufacturing technology, which employs a switching scheme of an MOS transistor for transporting photo-electric charges from a photodiode to an output node as well as detection of an output signal at the output node. In contrast with a charge coupled device (CCD) image sensor, the CMOS image sensor has following merits; its driving scheme is simplified and various scanning schemes may be implemented; it allows a signal processing circuit to be integrated on a single chip thereby minimize products; and it secures lower production costs and low power consumptions.

Referring to FIG. 1, there is shown a circuit diagram of a conventional unit pixel in a CMOS image sensor. In FIG. 1, the conventional unit pixel in the CMOS image sensor includes one photodiode 11 and four NMOS transistors 12, 14, 15 and 16. The four transistors include a transfer transistor 12 for transferring the photo-electric charges generated from the photodiode 11 to a floating diffusion region 13, a reset transistor 14 for discharging the charges stored in the floating diffusion node 13 to detect subsequent signals, a drive transistor 15 acting as a source follower, and a selection transistor 16 for switching and addressing. In FIG. 1, a denotation of $C_F$, $C_P$, and LD represent a capacitance of the floating diffusion node 13, a capacitance of the photodiode 11 and a load transistor, respectively.

In the conventional unit pixel circuit, the transfer transistor 12 having source/drain regions is disposed between the photodiode 11 and the floating diffusion node 13, wherein a transfer control signal is applied to a transfer gate. Furthermore, the reset transistor having source/drain regions is disposed between the floating diffusion node 13 and a power supply voltage (VDD) terminal, wherein a reset control signal is applied to a reset gate. Furthermore, a drive gate is connected to the floating diffusion node 13 and a drain of the drive transistor 15 is connected to the VDD terminal. A source of the selection transistor 16 is connected to the drain of the drive transistor 15 and a drain of the selection transistor 16 is connected to an output terminal, wherein a select control signal is applied to a select gate. Meanwhile, the load transistor having source/drain regions is disposed between the selection transistor 16 and a ground voltage terminal, wherein a bias voltage is applied to a load gate.

Referring to FIG. 1B, there is shown a plane view setting forth the conventional unit pixel in the CMOS image sensor.

In FIG. 1B, a transfer gate (Tx) is overlapped a predetermined portion of an active area where the photodiode 11 will be formed. At the other side of the transfer gate (Tx), there is formed the floating diffusion region 17. From the photodiode 11 to the floating diffusion region 17, an interface area is reduced like a bottle neck, wherein the photodiode 11 has relatively a large area in comparison with the others. In a counterclockwise direction from the photodiode 11, there are formed a reset gate (Rx), a drive gate (Dx) and a select gate (Sx) in series. Herein, each gate is separated by each predetermined distance. A VDD contact (VDD CT) is electrically connected to an active area disposed between the reset gate (Rx) and the drive gate (Dx). An output contact is electrically connected to an active area disposed aside the select gate (Sx).

In the conventional unit pixel, there are five metal interconnection contacts therein including a transfer contact (Tx CT) for applying the transfer control signal to the transfer gate (Tx), a floating diffusion contact (FD CT) and a drive contact (Dx CT) for connecting the floating diffusion node 13 to the drive gate (Dx), the VDD contact (VDD CT) for applying a power supply voltage and an output contact for outputting a predetermined signal.

However, the conventional unit pixel in the CMOS image sensor has a disadvantage that it is difficult to reduce the capacitance of the floating diffusion node 13 for securing a dynamic range of the CMOS image sensor. That is, since there is the floating diffusion contact (FD CT) in the floating diffusion region 17, there is a limitation to increase an area for the floating diffusion region 17 because of a restriction of a design rule.

Moreover, the five contacts, i.e., three active contacts and two poly contacts, exist in the conventional unit pixel so that a bad pixel fail is likely to be happened such as a dark bad pixel, a white bad pixel or a saturation bad pixel, during a process for etching contacts with high aspect ratios and a gap-fill process.

Additionally, since the active area for the selection transistor 16 and the drive transistor 15 is not isolated from another active area for the reset transistor and the transfer transistor, a leakage current may have a detrimental effect on the drive transistor 15 and the selection transistor 16 when a high VDD is applied to the VDD contact (VDD CT).

SUMMARY OF THE INVENTION

It is, therefore, an object of the present invention to provide a unit pixel in a complementary metal oxide semiconductor (CMOS) image sensor with a high sensitivity by modifying a unit pixel circuit and a pixel layout.

In accordance with one aspect of the present invention, there is provided a unit pixel in a CMOS image sensor, including: an active area defined by a field oxide (FOX); a photodiode formed in a predetermined location of the active area; a transfer transistor including source/drain regions disposed between the photodiode and a floating diffusion node, wherein a transfer control signal is applied to a gate thereof; a reset transistor including source/drain regions disposed between the floating diffusion node and a power supply voltage (VDD) terminal, wherein a reset control signal is applied to a gate and a VDD is applied to a drain; a drive transistor of which a gate is connected to the VDD terminal and a drain is connected to the floating diffusion node; and a selection transistor of which a drain is connected to a source of the drive transistor and a source is connected to an output terminal, wherein a select control signal is applied to a gate thereof.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1A:
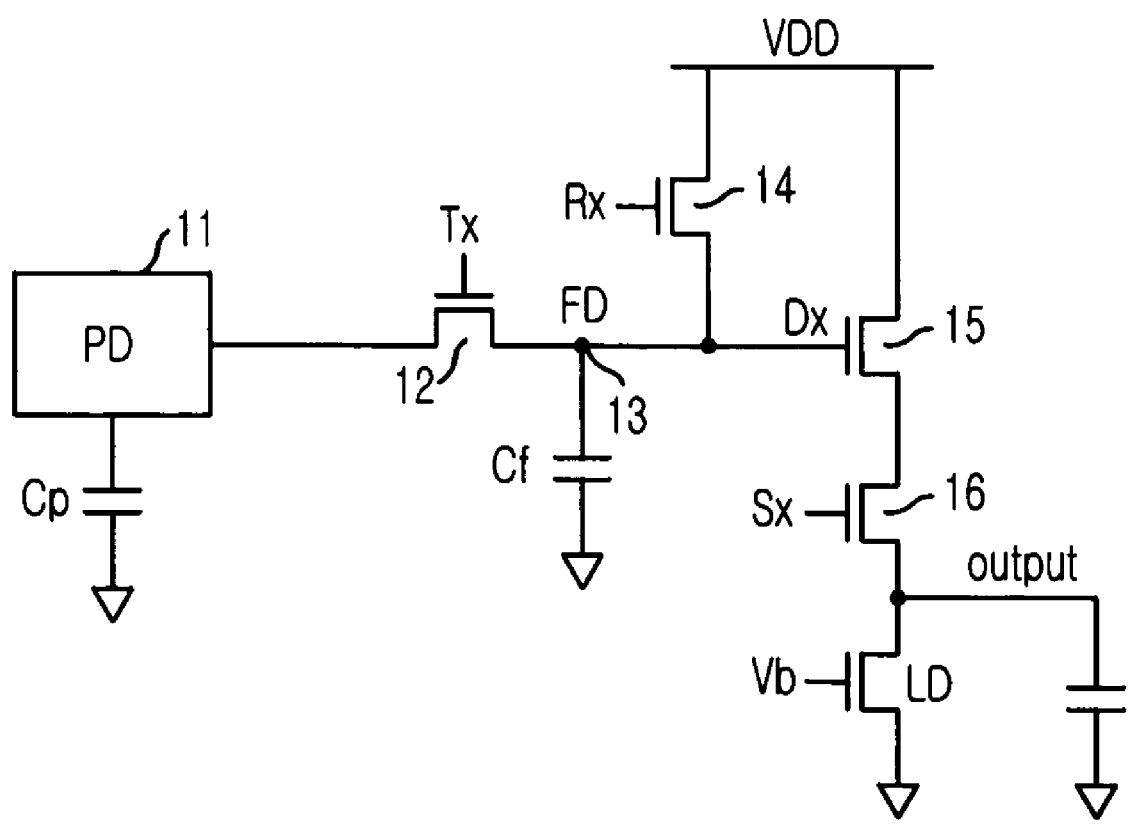
FIG. 1A is a circuit diagram setting forth a conventional unit pixel in a complementary metal oxide semiconductor (CMOS) image sensor.
Figure 1B:
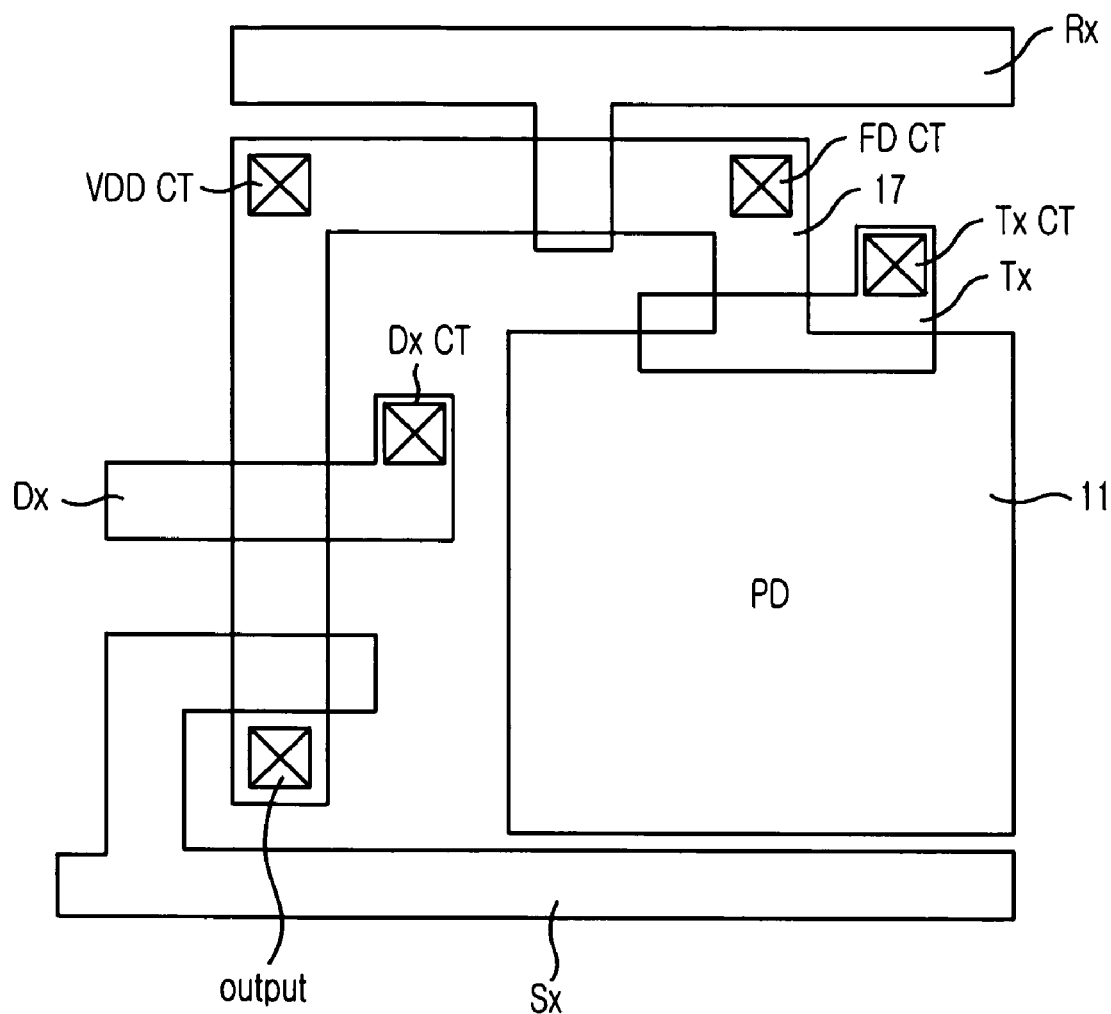
FIG. 1B is a plane view setting forth the conventional unit pixel in the CMOS image sensor.
Figure 2A:
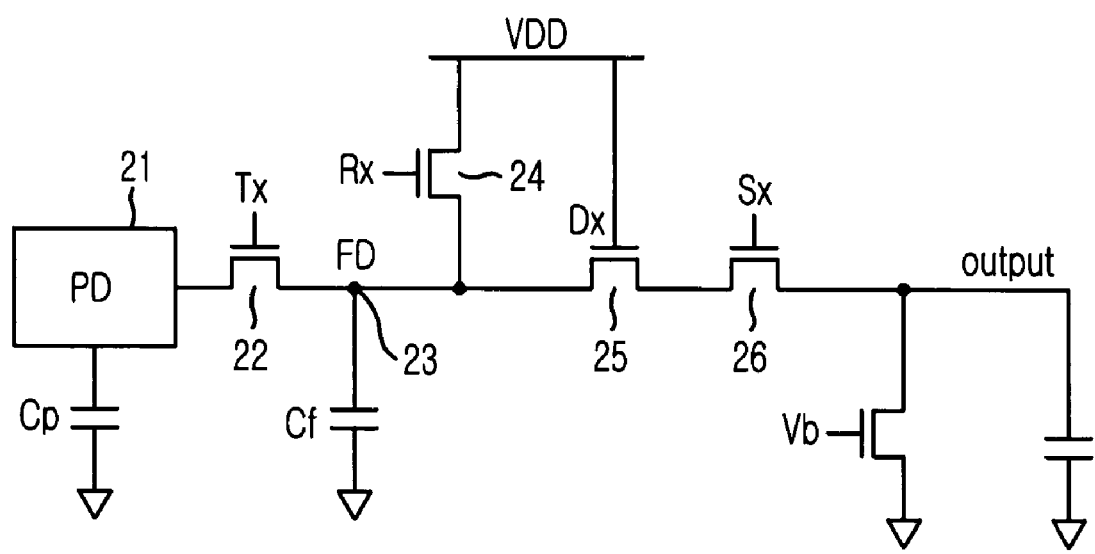
FIG. 2A is a circuit diagram setting forth a unit pixel in a CMOS image sensor in accordance with a first preferred embodiment of the present invention.

Referring to FIG. 2A, there is shown a circuit diagram setting forth a unit pixel in a CMOS image sensor in accordance with a first preferred embodiment of the present invention.

In FIG. 2A, the unit pixel includes a photodiode 21 and four NMOS transistors 22, 24, 25 and 26. The four transistors include a transfer transistor 22 for transferring photoelectric charges generated from the photodiode 21 to a floating diffusion node 23, a reset transistor 24 for discharging the charges stored in the floating diffusion node 23 to detect subsequent signals, a drive transistor 25 acting as a source follower, and a selection transistor 26 for switching and addressing.

In detail, the transfer transistor 22 having source/drain regions is disposed between the photodiode 21 and the floating diffusion node 23, wherein a transfer control signal is applied to a transfer gate (Tx). The reset transistor 24 having source/drain regions is disposed between the floating diffusion node 23 and a power supply voltage (VDD) terminal, wherein a reset control signal is applied to a reset gate (Rx) and a VDD is applied to a drain of the reset transistor 24. In the drive transistor 25, a drive gate (Dx) is connected to the VDD terminal and a drain of the drive transistor 25 is connected to the floating diffusion node 23. Meanwhile, the selection transistor 26 has source/drain regions of which a drain is connected to the source of the drive transistor 25 and a source of the selection transistor 26 is connected to an output terminal through an output contact, wherein a select control signal is applied to a select gate (Sx). In FIG. 2A, a denotation of $C_F$, $C_P$, and Vb represent a capacitance of the floating diffusion region, a capacitance of the photodiode and a bias voltage, respectively.

In the first embodiment, the VDD is applied to the drive gate (Dx) so that the drive transistor 25 is always turned on. Therefore, it is not required a threshold voltage for inversion of charge carriers in the drive transistor 25. That is, since the drain of the drive transistor 25 is connected to the floating diffusion node 23, the drive transistor 25 can operate although a low voltage of less than the threshold voltage from the floating diffusion node 23 is applied thereto, thereby securing the CMOS image sensor with a high sensitivity.

Figure 2B:
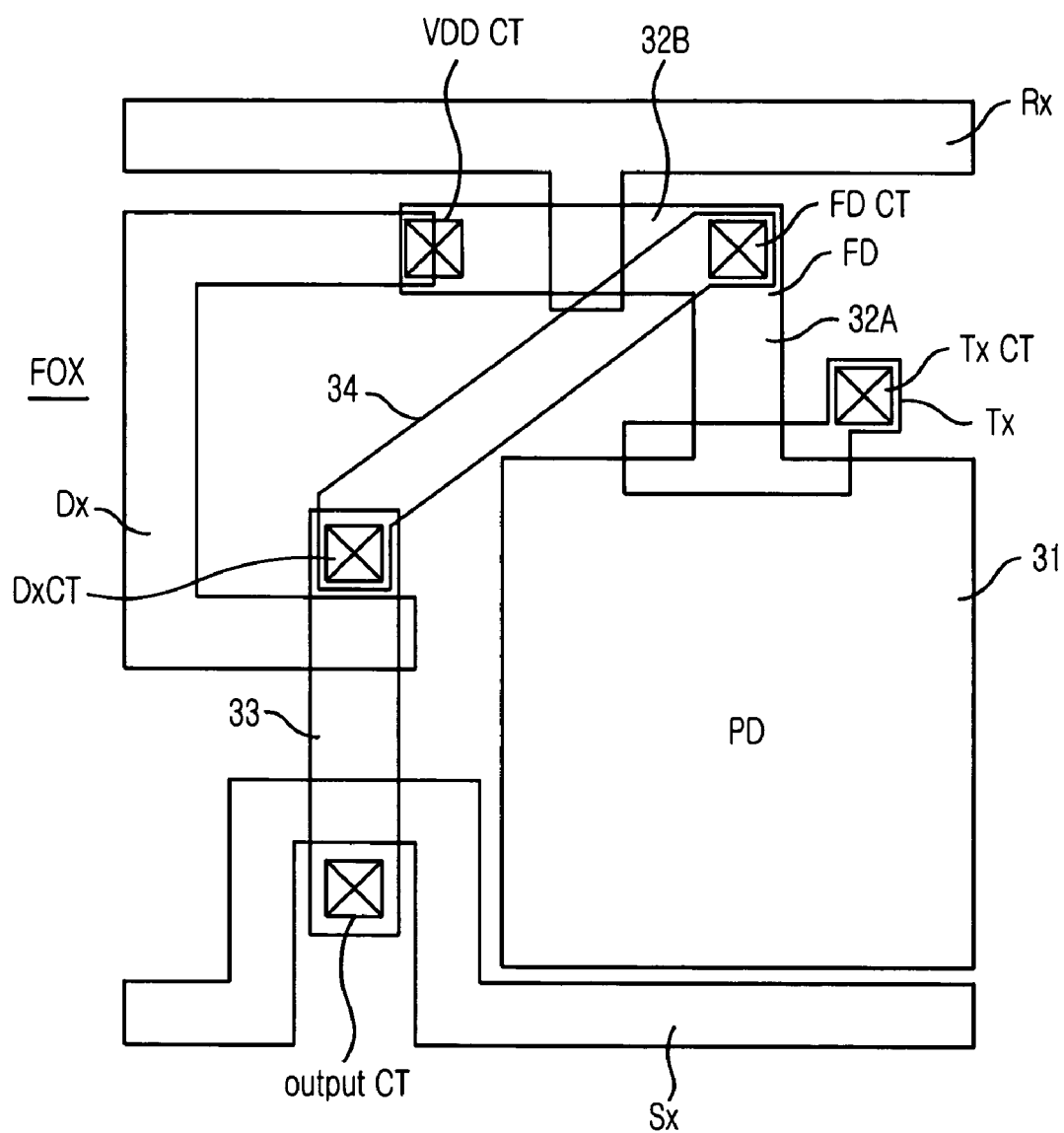
FIG. 2B is a plane view setting forth the unit pixel in the CMOS image sensor in accordance with the first preferred embodiment of the present invention.

Referring to FIG. 2B, there is shown a plane view setting forth the unit pixel in the CMOS image sensor in accordance with the first preferred embodiment of the present invention.

In FIG. 2B, an active area of the unit pixel includes a first active area 31 where the photodiode 21 will be formed, a second active area 32 having a first region 32A and a second region 32B and a third active area 33 where the drive transistor 25 and the selection transistor 26 are formed. Herein, the first region 32A of the second active area 32 is formed extended from a middle portion of a side of the first active area 31 and the second region 32B is perpendicularly in contact with the first region 32A, wherein a width of the first region 32A is same to that of the second region 32B. In the first region 32A, there are formed the transfer transistor 22 and the floating diffusion node 23. Meanwhile, the reset transistor 24 is formed in the second region 32B. The third active area 33 is separated from the first active area 31 and the second active area 32 by predetermined distances. In particular, the third active area 33 for the drive transistor 25 and the selection transistor 26 is electrically isolated from the second active area 32 for the transfer transistor 22 and the reset transistor 24 by an FOX area unlike the conventional unit pixel. Therefore, it is possible to prevent a detrimental effect of the leakage current on the drive transistor 25 and the selection transistor 26 although a high VDD is applied thereto.

In detail, the transfer gate (Tx) is formed over an interface between the first active area 31 and the first region 32A of the second active area 32. In addition, the reset gate (Rx) is formed overlapping partially a predetermined portion of the second region 32B of the second active area 32. Furthermore, the drive gate (Dx) and the select gate (Sx) are formed overlapping partially preset portions of the third active area 33. Here, it is noted that one end of the drive gate (Dx) is extended to an end of the second region 32B of the second active area 32 so that the drive gate (Dx) is connected to the VDD contact (VDD CT) which is formed at the end of the second region 32B.

Meanwhile, in the unit pixel, there is a transfer contact (Tx CT) connected to the transfer gate (Tx), a floating diffusion contact (FD CT), the VDD contact (VDD CT), a drive contact (Dx CT) formed at one end of the third active area 33 and an output contact formed at the other end of the third active area 33. Herein, the drive contact (Dx CT) is connected to the drain of the drive transistor 25. That is, the drain of the drive transistor 25 is connected to the floating diffusion node 23 through each of the drive contact (Dx CT) and the floating diffusion contact (FD CT) by means of a metal interconnection 34. The VDD contact (VDD CT) for applying the VDD to the drain of the reset transistor 25 and the drive gate (Dx) has a butting contact structure so that it is not necessary to form a supplementary contact on a predetermined portion of the drive gate (Dx) in the first embodiment.

Figure 3A:
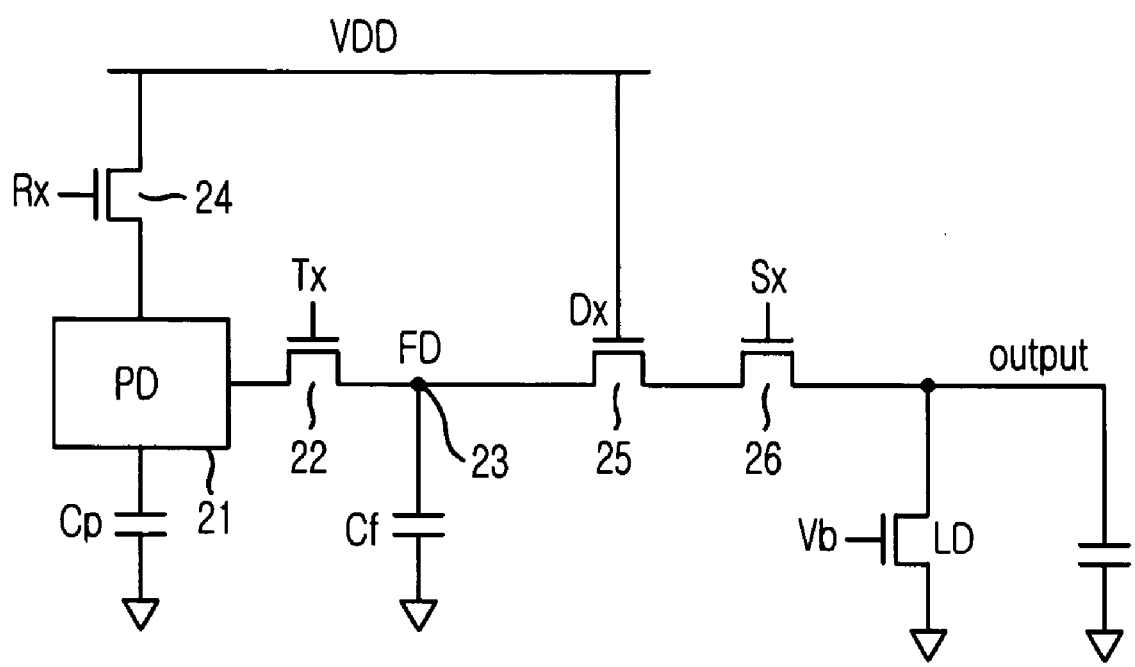
FIG. 3A is a circuit diagram setting forth a unit pixel in a CMOS image sensor in accordance with a second preferred embodiment of the present invention.

Referring to FIG. 3A, there is shown a circuit diagram setting forth a unit pixel in a CMOS image sensor in accordance with a second preferred embodiment of the present invention.

In FIG. 3A, the unit pixel includes a photodiode 21 and four NMOS transistors 22, 24, 25 and 26. The four transistors include a transfer transistor 22 for transferring photoelectric charges generated from the photodiode 21 to a floating diffusion node 23, a reset transistor 24 for discharging the charges stored in the floating diffusion node 23 to detect subsequent signals, a drive transistor 25 acting as a source follower, and a selection transistor 26 for switching and addressing.

In detail, the transfer transistor 22 having source/drain regions is disposed between the photodiode 21 and the floating diffusion node 23, wherein a transfer control signal is applied to a transfer gate (Tx). The reset transistor 24 having source/drain regions is disposed between the photodiode 21 and a power supply voltage (VDD) terminal, wherein a reset control signal is applied to a reset gate (Rx) and a VDD is applied to a drain of the reset transistor 24. In the drive transistor 25, the VDD is applied to a gate and a drain of the drive transistor 25 is connected to the floating diffusion node 23. Meanwhile, the selection transistor 26 has source/drain regions of which a drain is connected to the source of the drive transistor 25 and a source of the selection transistor 26 is connected to an output terminal through an output contact, wherein a select control signal (Sx) is applied to a select gate (Sx). In FIG. 2A, a denotation of $C_F$, $C_P$, and LD represent a capacitance of the floating diffusion region, a capacitance of the photodiode and a load transistor in which a bias voltage is applied to a gate thereof, respectively.

In the second embodiment, the reset transistor 24 is directly connected to the photodiode 21 so that a reset efficiency of the photodiode 21 can be enhanced in comparison with the first embodiment. In addition, the VDD is applied to the drive gate (Dx) so that the drive transistor 25 is always turned on. Therefore, it is not required a threshold voltage for inversion of charge carriers in the drive transistor 25. That is, since the drain of the drive transistor 25 is connected to the floating diffusion node 23, the drive transistor 25 can operate although a low voltage of less than the threshold voltage from the floating diffusion node 23 is applied thereto, thereby securing the CMOS image sensor with a high sensitivity.

Figure 3B:
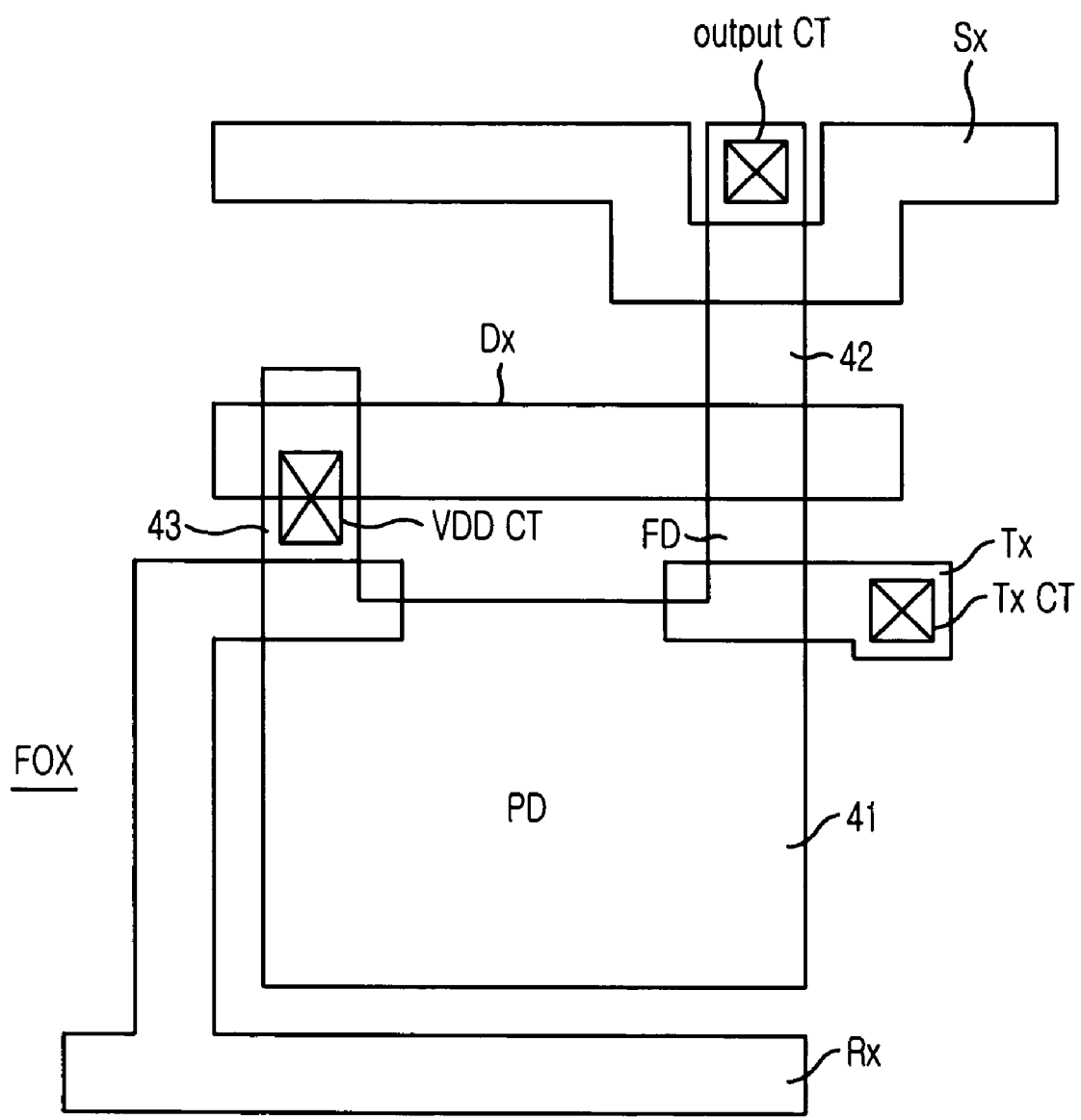
FIGS. 3B and 3C are plane views setting forth the unit pixel in the CMOS image sensor in accordance with the second preferred embodiment of the present invention.

Referring to FIG. 3B, there is shown a plane view setting forth the unit pixel in the CMOS image sensor in accordance with the second preferred embodiment of the present invention.

In FIG. 3B, an active area of the unit pixel includes a first active area 41 where the photodiode 21 will be formed, a second active area 42 where the transfer transistor 22, the floating diffusion node 23 and the selection transistor 26 are formed and a third active area 43 where the reset transistor 24 is formed. Herein, the second active area 42 is formed extended from one end of a side of the photodiode 21 and the third active area 43 is formed extended from the other end of the side of the photodiode 21, wherein the second active area 42 is relatively longer than the third active area 43. In the second embodiment, a drain of the drive transistor 25 is connected to the floating diffusion node 23 without any contact. That is, since the drain of the drive transistor 25 and the floating diffusion node can be formed by means of an ion-implantation, it is possible to connect the drain of the drive transistor 25 to the floating diffusion node 23 without any contact, i.e., a floating diffusion contact.

In detail, there is the transfer gate (Tx) over an interface between the first active area 41 and the second active area 42. Also, the drive gate (Dx) and the select gate (Sx) are formed over the first active area 41 which are separated from each other by a predetermined distance. Here, one end of the drive gate (Dx) is extended to the third active area 43 so that the drive gate (Dx) is connected to the VDD contact (VDD CT). A reset gate (Rx) is formed over an interface between the first active area 41 and the third active area 43. In detail, the drain of the reset transistor 24 is connected to the VDD contact, whereby the VDD is applied thereto. Herein, from a portion of the reset gate (Rx) disposed over the interface between the first active area 41 and the third active area 43, the reset gate (Rx) is extended to an FOX like a shape of a capital alphabet "L" around the first active area 41.

In the unit pixel of the second embodiment, there are three contacts including a transfer contact (Tx CT) connected to the transfer gate (Tx), the VDD contact (VDD CT) formed at the third active area 43 and an output contact formed at one end of the second active area 42. Herein, the drain of the drive transistor 25 is directly connected to the floating diffusion node 23 without a contact, as aforementioned, so that a supplementary metal interconnection is not required in the second embodiment. Furthermore, the VDD contact (VDD CT) for applying the VDD to the drain of the reset transistor 25 and the drive gate (Dx), is formed as a butting contact structure so that it is not necessary to form a supplementary contact on the drive gate (Dx).

In accordance with the second embodiment, since the second active area 42 for the drive transistor 25 and the selection transistor 26 is electrically isolated from the third active area 43 for the reset transistor 34, it is possible to prevent a detrimental effect of the leakage current on the drive transistor 25 and the selection transistor 26 although a high VDD is applied thereto. Furthermore, there are only three contacts, i.e., the transfer contact, the VDD contact and the output contact, in the second embodiment so that a bad pixel fail can be reduced in comparison with the conventional unit pixel incorporating therein five contacts. In addition, the active area except the first active area 41 for the photodiode 21 has relatively a small area in comparison with the first active area 41, thereby increasing a fill-factor.

Figure 3C:
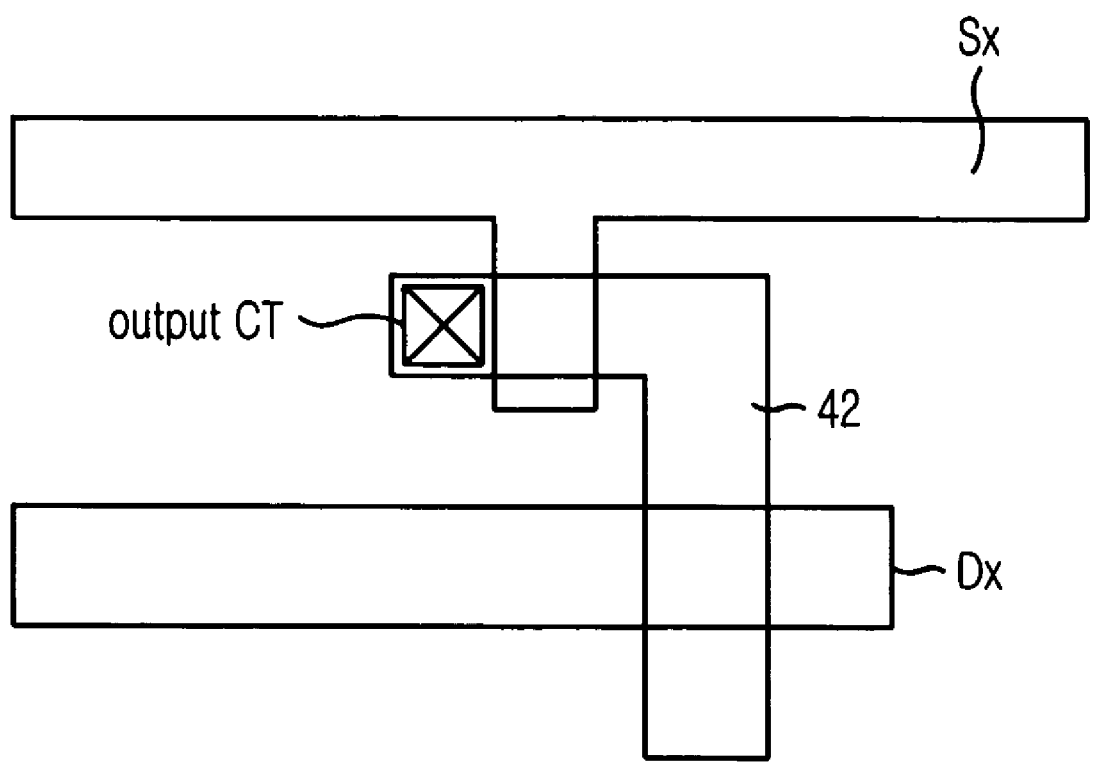

Referring to FIG. 3C, there is shown another schematic plane view setting forth the unit pixel in the CMOS image sensor in accordance with the second preferred embodiment of the present invention.

In FIG. 3C, since the other elements except the second active area 42 and the select gate (Sx) are same configuration to those depicted in FIG. 3B, further descriptions are abbreviated herein. That is, while the second active area 42 is straightforwardly formed from one end of the side of the first active area 41 and the select gate (Sx) is partially overlapped a preset portion of the second active area 42, it is possible to form the second active area 42 of which one end is bended perpendicularly to be connected to a portion of the select gate (Sx) having a shape of a capital alphabet "T", alternatively.

Figure 4:
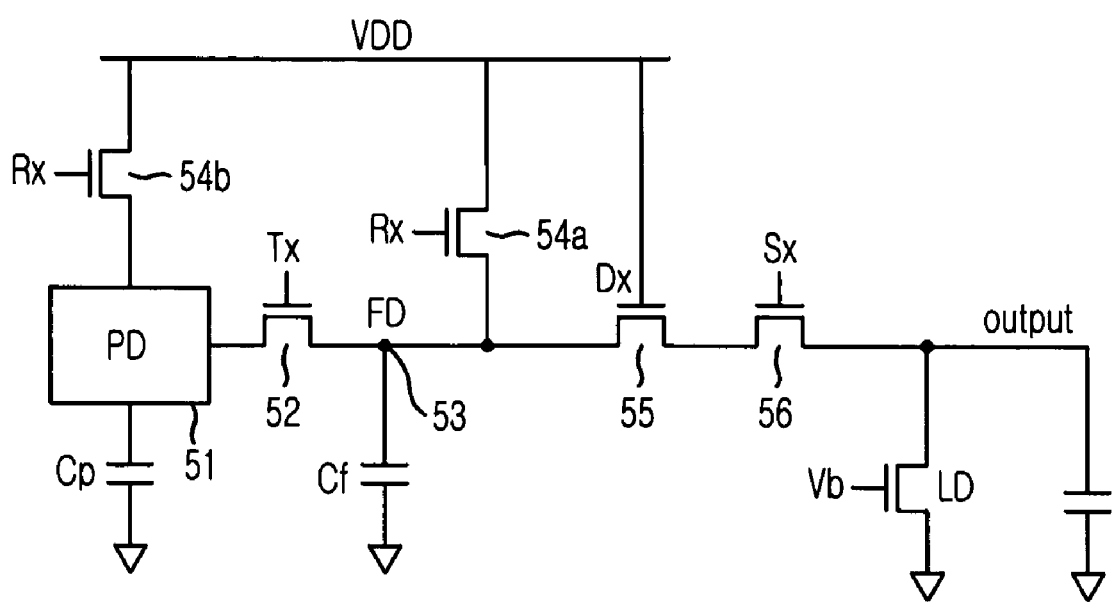
FIG. 4 is a circuit diagram setting forth a unit pixel in a CMOS image sensor in accordance with a third preferred embodiment of the present invention.

Referring to FIG. 4, there is shown a circuit diagram setting forth a unit pixel in a CMOS image sensor in accordance with a third preferred embodiment of the present invention.

In FIG. 4, the unit pixel includes a photodiode 51 and five NMOS transistors 52, 54A, 54B, 55 and 56. The five transistors include a transfer transistor 52 for transferring photo-electric charges generated from the photodiode 51 to a floating diffusion node 53, a first reset transistor 54A and a second reset transistor 54B for discharging the charges stored in the floating diffusion node 53 to detect subsequent signals, a drive transistor 55 acting as a source follower, and a selection transistor 56 for switching and addressing.

In detail, the transfer transistor 52 having source/drain regions is disposed between the photodiode 51 and the floating diffusion node 53, wherein a transfer control signal is applied to a transfer gate (Tx). The first reset transistor 54A having source/drain regions is disposed between the floating diffusion node 53 and a VDD terminal, wherein a first reset control signal is applied to a first reset gate ($Rx_1$) and a VDD is applied to a drain of the first reset transistor 54A. The second reset transistor 54B having source/drain regions is disposed between the photodiode 51 and the VDD terminal, wherein a reset control signal is applied to the second reset gate (Rx$_2$) and the VDD is applied also to the drain of the second reset transistor 54B. In the drive transistor 55, the VDD is applied to a drive gate (Dx) and a drain of the drive transistor 55 is connected to the floating diffusion node 53. Meanwhile, the selection transistor 56 has source/drain regions of which a drain is connected to the source of the drive transistor 55 and a source of the selection transistor 56 is connected to an output terminal through an output contact, wherein a select control signal (Sx) is applied to a select gate (Sx). In FIG. 4, a denotation of $C_F$, $C_P$, and LD represent a capacitance of the floating diffusion region, a capacitance of the photodiode and a load transistor in which a bias voltage is applied to a gate thereof, respectively.

In the third embodiment, the inventive unit pixel employs a first and a second reset transistors 54A, 54B so that a reset efficiency of the photodiode 51 and the floating node 53 are concurrently improved in comparison with the first and the second embodiments. Furthermore, the VDD is applied to the drive gate so that the drive transistor 55 is always turned on. Therefore, it is not required a threshold voltage for inversion of charge carriers in the drive transistor 55. That is, since the drain of the drive transistor 55 is connected to the floating diffusion node 53, the drive transistor 55 can operate although a low voltage of less than the threshold voltage from the floating diffusion node 53 is applied thereto, thereby securing the CMOS image sensor with a high sensitivity.

As described above, the present invention provides an advantage that the drive transistor can be operable despite a low voltage applied from the floating diffusion node because the VDD is applied to the drive gate, thereby securing the CMOS image sensor with the high sensitivity. In addition, since the active area for the drive transistor and the selection transistor and the other active area for the reset transistor are electrically isolated from each other by the FOX, it is possible to reduce a detrimental effect on the drive transistor and the selection transistor due to the leakage current generated when the high VDD is applied thereto. Furthermore, the number of the contacts is reduced so that it is possible to reduce a possibility of the bad pixel fail in the CMOS image sensor.

While the present invention has been described with respect to the particular embodiments, it will be apparent to those skilled in the art that various changes and modifications may be made without departing from the scope of the invention as defined in the following claims.

What is claimed is:

1. A unit pixel for use in a complementary metal oxide semiconductor (CMOS) image sensor, comprising:
   an active area defined by a field oxide (FOX);
   a photodiode formed in a predetermined location of the active area;
   a transfer transistor disposed between the photodiode and a floating diffusion node, wherein a transfer control signal is applied to a gate thereof;
   a reset transistor disposed between the floating diffusion node and a power supply voltage (VDD) terminal, wherein a reset control signal is applied to a gate and a VDD is applied to a drain;
   a drive transistor of which a gate is connected to the VDD terminal and a drain is connected to the floating diffusion node; and
   a selection transistor of which a drain is connected to a source of the drive transistor and a source is connected to an output terminal, wherein a select control signal is applied to a gate thereof.

2. The unit pixel as recited in claim 1, wherein the drain of the drive transistor is electrically connected to the floating diffusion node through a metal interconnection.

3. The unit pixel as recited in claim 1, wherein the active area includes:
   a first active area where the photodiode is formed;
   a second active area having a first region and a second region where the transfer transistor, the floating diffusion node and the reset transistor are formed, the second active area being connected to a side of the photodiode; and
   a third active area where the drive transistor and the selection transistor are formed, wherein the third active area is separated from the first and the second active areas by predetermined distances.

4. The unit pixel as recited in claim 3, wherein the third active area is electrically isolated from the second active area by an FOX area.

5. The unit pixel as recited in claim 3, wherein the second active area has a first region for the transfer transistor and the floating diffusion node and a second region for the reset transistor, wherein the first region is extended from a middle portion of the side of the first active area and the second region is in contact with the first region perpendicularly of which one end is connected to a VDD contact.

6. The unit pixel as recited in claim 5, wherein a gate of the transfer transistor is formed over an interface between the first active area and the first region of the second active area and a gate of the reset transistor is formed over a portion of the second region of the second active area.

7. The unit pixel as recited in claim 5, wherein a gate of the drive transistor and a gate of the selection transistor are formed over portions of the third active area which are separated from each other by a predetermined distance.

8. The unit pixel as recited in claim 5, wherein one end of the drive gate is extended to the second region so as to be connected to the VDD contact.

9. The unit pixel as recited in claim 8, wherein the VDD contact has a butting contact structure.

10. The unit pixel as recited in claim 1, further comprising another reset transistor disposed between the photodiode and the VDD terminal, wherein a reset control signal is applied to a gate and a VDD is applied to a drain.

11. A unit pixel for use in a CMOS image sensor, comprising:
    an active area defined by a field oxide (FOX);
    a photodiode formed in a predetermined location of the active area;
    a transfer transistor disposed between the photodiode and a floating diffusion node, wherein a transfer control signal is applied to a gate thereof;
    a reset transistor disposed between the photodiode and a VDD terminal, wherein a reset control signal is applied to a gate and a VDD is applied to a drain;
    a drive transistor of which a gate is connected to the VDD terminal and a drain is connected to the floating diffusion node; and
    a selection transistor of which a drain is connected to a source of the drive transistor and a source is connected to an output terminal, wherein a select control signal is applied to a gate thereof.

12. The unit pixel as recited in claim 11, wherein the active area includes:
- a first active area where the photodiode is formed;
- a second active area where the transfer transistor, the floating diffusion node, the drive transistor and the selection transistor are formed, the second active area being formed extended from one end of a side of the photodiode; and
- a third active area where the reset transistor is formed, wherein a VDD contact is connected to one end of the third active area, the third active area being formed extended from the other end of the side of the photodiode.

13. The unit pixel as recited in claim 12, wherein a gate of the transfer transistor is formed over an interface between the first active area and the second active area and a gate of the drive transistor and a gate of the selection transistor are formed over portions of the second active area separated from each other by a preset distance.

14. The unit pixel as recited in claim 12, wherein a gate of the reset transistor is formed over an interface between the first active area and the third active area.

15. The unit pixel as recited in claim 13, wherein one end of the gate of the drive transistor is extended to the third active area so as to be connected to the VDD terminal through a butting contact.

16. The unit pixel as recited in claim 11, wherein the floating diffusion node is connected to the drive transistor without a contact by means of an ion-implantation into a predetermined portion of the second active area.

17. The unit pixel as recited in claim 11, further comprising another reset transistor disposed between the floating diffusion node and the VDD terminal, wherein a reset control signal is applied to a gate and a VDD is applied to a drain.

* * * * *